(12) United States Patent
Hadwan et al.

(10) Patent No.: US 11,839,043 B2
(45) Date of Patent: Dec. 5, 2023

(54) ELECTRONIC DEVICE WITH SEALED HOUSING

(71) Applicant: Robert Bosch GmbH, Stuttgart (DE)

(72) Inventors: Hadwan Hadwan, Detroit, MI (US);
John Janson, Plymouth, MI (US);
Ligor Manushi, Northville, MI (US);
Jeff Reuter, Farmington, MI (US);
Jesus Antonio Marin Bello, Guadalajara (MX); Mark Ryskamp, Grosse Pointe Park, MI (US);
Alexander Tsang, Ann Arbor, MI (US);
Andrew Yermak, Farmington Hills, MI (US); Hiram Avalos, Detroit, MI (US);
Kenneth Bouman, Livonia, MI (US)

(73) Assignees: Robert Bosch LLC, Broadview, IL (US); Robert Bosch GmbH, Stuttgart (DE)

( * ) Notice: Subject to any disclaimer, the term of this patent is extended or adjusted under 35 U.S.C. 154(b) by 399 days.

(21) Appl. No.: 17/243,953

(22) Filed: Apr. 29, 2021

(65) Prior Publication Data
US 2022/0354011 A1 Nov. 3, 2022

(51) Int. Cl.
*H05K 5/06* (2006.01)
*H05K 5/00* (2006.01)
*H05K 9/00* (2006.01)
*B60R 16/023* (2006.01)

(52) U.S. Cl.
CPC ......... *H05K 5/061* (2013.01); *B60R 16/0238* (2013.01); *H05K 5/0043* (2013.01); *H05K 5/069* (2013.01); *H05K 9/0015* (2013.01)

(58) Field of Classification Search
CPC ...... H05K 5/0026; H05K 5/0043; H05K 5/06; H05K 5/061; H01R 13/5202; H01R 13/5219
See application file for complete search history.

(56) References Cited

U.S. PATENT DOCUMENTS

| | | | | | |
|---|---|---|---|---|---|
| 4,875,140 | A | * | 10/1989 | Delpech ................. | H05K 7/142 174/138 D |
| 5,223,996 | A | * | 6/1993 | Read ...................... | G11B 33/08 360/99.18 |
| 5,363,276 | A | * | 11/1994 | Crockett ................ | H05K 7/142 361/752 |
| 5,394,306 | A | * | 2/1995 | Koenck ................... | H02B 1/48 174/544 |
| 5,608,611 | A | * | 3/1997 | Szudarek ............. | H05K 9/0039 361/753 |

(Continued)

FOREIGN PATENT DOCUMENTS

WO 2010019912 2/2010

*Primary Examiner* — Adrian S Wilson
(74) *Attorney, Agent, or Firm* — Charles Wesley Duncan, Jr.; Maginot, Moore & Beck LLP

(57) ABSTRACT

An improved ECU for a motor vehicle comprises a housing that includes a top portion and a bottom portion each with an associated gasket. A printed circuit board (PCB) is enclosed between the housing portions. The gaskets provide seals between the housing, portions and respective sides of the PCB and apply balanced forces to each side to minimize strain on the PCB. One or both gaskets may be electromagnetic compliance gaskets.

20 Claims, 6 Drawing Sheets

(56) References Cited

U.S. PATENT DOCUMENTS

| | | | |
|---|---|---|---|
| 5,613,237 A * | 3/1997 | Bent | H04B 1/086 |
| | | | 361/752 |
| 6,362,978 B1 * | 3/2002 | Boe | G06F 1/184 |
| | | | 248/65 |
| 6,407,925 B1 * | 6/2002 | Kobayashi | H05K 5/0052 |
| | | | 361/752 |
| 6,532,152 B1 * | 3/2003 | White | G02F 1/133308 |
| | | | 312/223.1 |
| 6,560,119 B1 * | 5/2003 | Katsuyama | H05K 7/142 |
| | | | 361/752 |
| 6,717,051 B2 * | 4/2004 | Kobayashi | B60R 16/0239 |
| | | | 361/752 |
| 6,768,654 B2 * | 7/2004 | Arnold | B29C 45/14811 |
| | | | 361/752 |
| 6,775,154 B1 | 8/2004 | Seely et al. | |
| 6,839,240 B2 * | 1/2005 | Skofljanec | H05K 7/142 |
| | | | 361/752 |
| 7,283,999 B1 | 11/2007 | Everett et al. | |
| 7,733,667 B2 * | 6/2010 | Qin | H05K 13/00 |
| | | | 361/742 |
| 8,027,164 B2 * | 9/2011 | Peck | H05K 7/142 |
| | | | 361/752 |
| 8,178,793 B2 * | 5/2012 | Morimoto | H04M 1/185 |
| | | | 277/640 |
| 8,747,774 B2 | 6/2014 | Doyle et al. | |
| 8,908,380 B2 * | 12/2014 | Ohhashi | H05K 5/006 |
| | | | 361/752 |
| 9,042,105 B2 * | 5/2015 | Malek | H05K 3/42 |
| | | | 361/752 |
| 9,235,240 B2 * | 1/2016 | Pakula | H04M 1/0266 |
| 9,504,172 B2 * | 11/2016 | Raschilla | H05K 5/0217 |
| 10,111,353 B2 * | 10/2018 | Ferran Palau | H05K 7/1427 |
| 10,368,457 B2 * | 7/2019 | Pakula | G02B 7/02 |
| 10,724,916 B2 * | 7/2020 | Harz | G01L 19/147 |
| 10,785,881 B2 * | 9/2020 | Stilianos | H05K 5/062 |
| 10,821,249 B2 | 11/2020 | Vazales et al. | |
| 11,122,698 B2 * | 9/2021 | Zack | H05K 5/0056 |
| 2005/0023022 A1 * | 2/2005 | Kriege | G06F 1/182 |
| | | | 174/559 |
| 2007/0025072 A1 * | 2/2007 | Liao | G06F 1/1616 |
| | | | 361/679.01 |
| 2007/0072452 A1 * | 3/2007 | Inagaki | H05K 5/0043 |
| | | | 439/76.2 |
| 2007/0134951 A1 * | 6/2007 | Inagaki | H05K 3/284 |
| | | | 439/74 |
| 2008/0259537 A1 * | 10/2008 | Arisaka | G06F 1/203 |
| | | | 361/759 |
| 2009/0003141 A1 * | 1/2009 | Ozawa | G04G 21/04 |
| | | | 368/294 |
| 2009/0255726 A1 * | 10/2009 | Yang | H05K 7/142 |
| | | | 174/544 |
| 2009/0296325 A1 * | 12/2009 | Morimoto | H04M 1/185 |
| | | | 361/679.01 |
| 2010/0103632 A1 * | 4/2010 | Kato | H05K 5/006 |
| | | | 361/752 |
| 2010/0214732 A1 * | 8/2010 | Charles | H05K 5/061 |
| | | | 264/496 |
| 2012/0320531 A1 * | 12/2012 | Hashimoto | H05K 7/20481 |
| | | | 361/720 |
| 2012/0320544 A1 * | 12/2012 | Ohhashi | H05K 5/062 |
| | | | 361/752 |
| 2013/0119908 A1 * | 5/2013 | Harada | B62D 5/0406 |
| | | | 318/400.42 |
| 2014/0334116 A1 * | 11/2014 | Lee | H05K 5/061 |
| | | | 361/752 |
| 2017/0188473 A1 * | 6/2017 | Suzuki | H05K 5/0043 |
| 2019/0297741 A1 * | 9/2019 | Pakula | G06F 1/1658 |
| 2020/0146161 A1 * | 5/2020 | Zack | H05K 3/0061 |
| 2020/0236797 A1 * | 7/2020 | Stilianos | H05K 5/0056 |

\* cited by examiner

ELECTRONIC DEVICE WITH SEALED HOUSING

BACKGROUND AND TECHNICAL FIELD

In the context of a motor vehicle, the term electronic control unit (ECU) refers to any computer embedded in the vehicle that controls one or more of the electrical systems or subsystems of the vehicle. Examples of different types of ECU include engine control modules, transmission control modules, brake control modules, body control modules, and others.

This disclosure relates to an improved ECU for a motor vehicle comprising a housing that includes a top portion and a bottom portion each with an associated gasket. A printed circuit board (PCB) is enclosed between the housing portions. The gaskets provide seals between the housing portions and respective sides of the PCB and apply balanced forces to each side to minimize strain on the PCB.

SUMMARY

ECUs are designed to last for the life of the vehicle. Thus, an ECU housing provides one or more seals around the PCB to prevent the incursion of dirt, moisture, or other contaminants that could shorten the life of the ECU. The seals might be disposed between housing portions or between the housing and the PCB. Such seals may be accomplished using gaskets. Establishing and maintaining such seals requires that the components to be sealed are secured with sufficient force to compress the gasket between the components. When one of the components to be sealed is a PCB, such force can put undue strain on the PCB.

In this context, strain is any force on an object tending to bend or otherwise deform its shape. Sealing a PCB against a housing can put strain on the PCB by essentially bending the PCB over the gasket. Over time, such strain on a PCB can lead to broken solder bonds and other issues causing unreliable ECU operation, thus shortening the working life of the ECU. Accordingly the ECU described herein includes a housing that minimizes strain on the PCB while also providing a reliable seal against contaminants.

One aspect of this disclosure is directed to an ECU for a motor vehicle. The ECU includes a top housing portion and a bottom housing portion, with a PCB enclosed between the housing portions. The PCB contains ECU circuitry. A top gasket provides a seal between the top housing portion and a top surface of the PCB. A bottom gasket provides a seal between the bottom housing portion and a bottom surface of the PCB.

Either or both of the housing portions may comprise an electromagnetic shield, which protects the ECU circuitry from any incoming electromagnetic interference and also blocks any outgoing electromagnetic interference. Where a housing portion comprises an electromagnetic shield, it is preferably sealed against the PCB with an electromagnetic compliance (EMC) gasket. Housing portions not comprising an electromagnetic shield are preferably made of molded plastic and sealed against the PCB with a thermoplastic elastomer (TPE) gasket.

Preferably, the gaskets on each side of the PCB are substantially equal in hardness and located substantially opposite one another about the PCB, so that any forces exerted by the gaskets on the PCB are balanced, thereby minimizing strain on the PCB.

The above aspects of this disclosure and other aspects will be explained in greater detail below with reference to the attached drawings.

DETAILED DESCRIPTION

The illustrated embodiments are disclosed with reference to the drawings. However, it is to be understood that the disclosed embodiments are intended to be merely examples that may be embodied in various and alternative forms. The figures are not necessarily to scale and some features may be exaggerated or minimized to show details of particular components. The specific structural and functional details disclosed are not to be interpreted as limiting, but as a representative basis for teaching one skilled in the art how to practice the disclosed concepts.

Figure 1A:
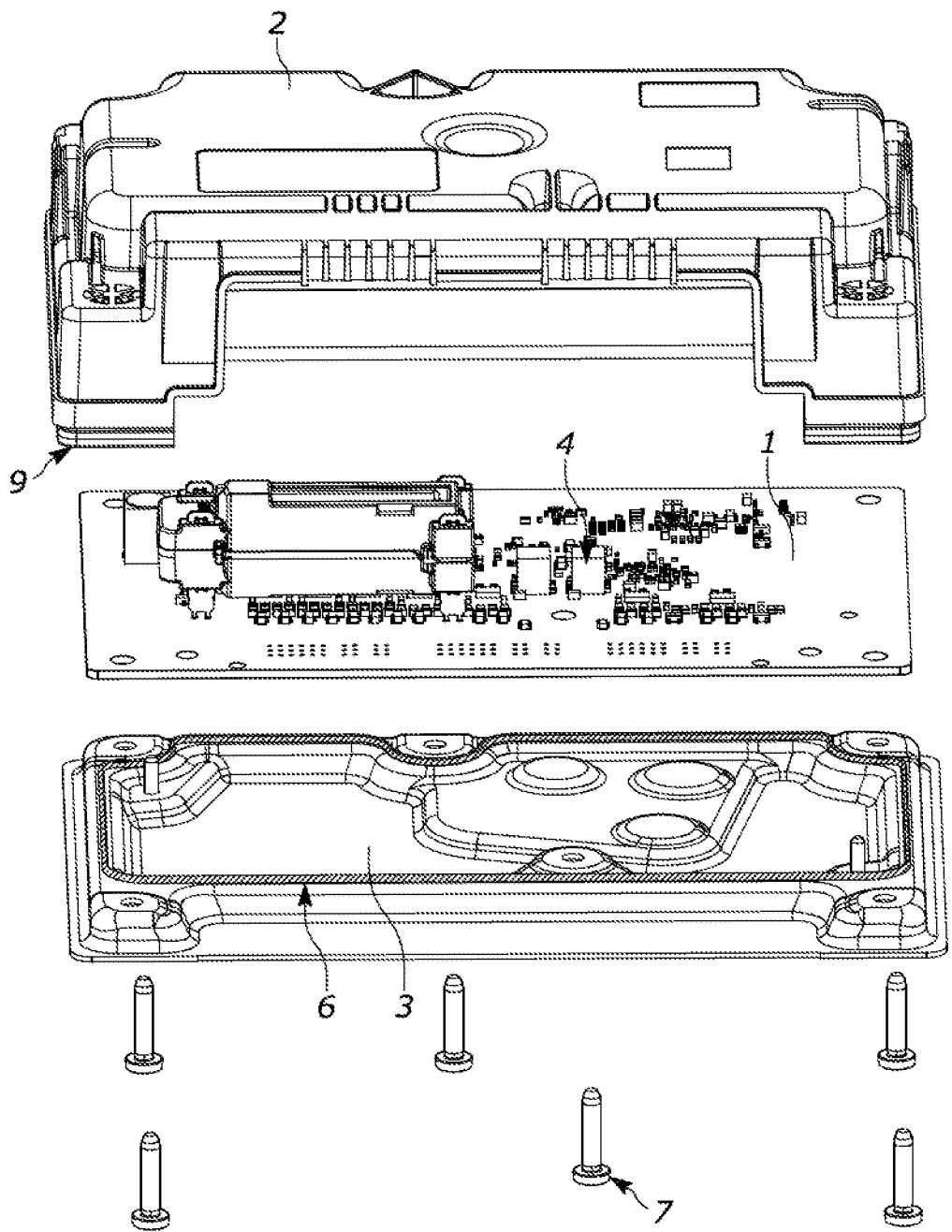
FIGS. 1a and 1b are two alternative perspectives of an exploded view of an improved ECU showing its mechanical construction.
Figure 1B:
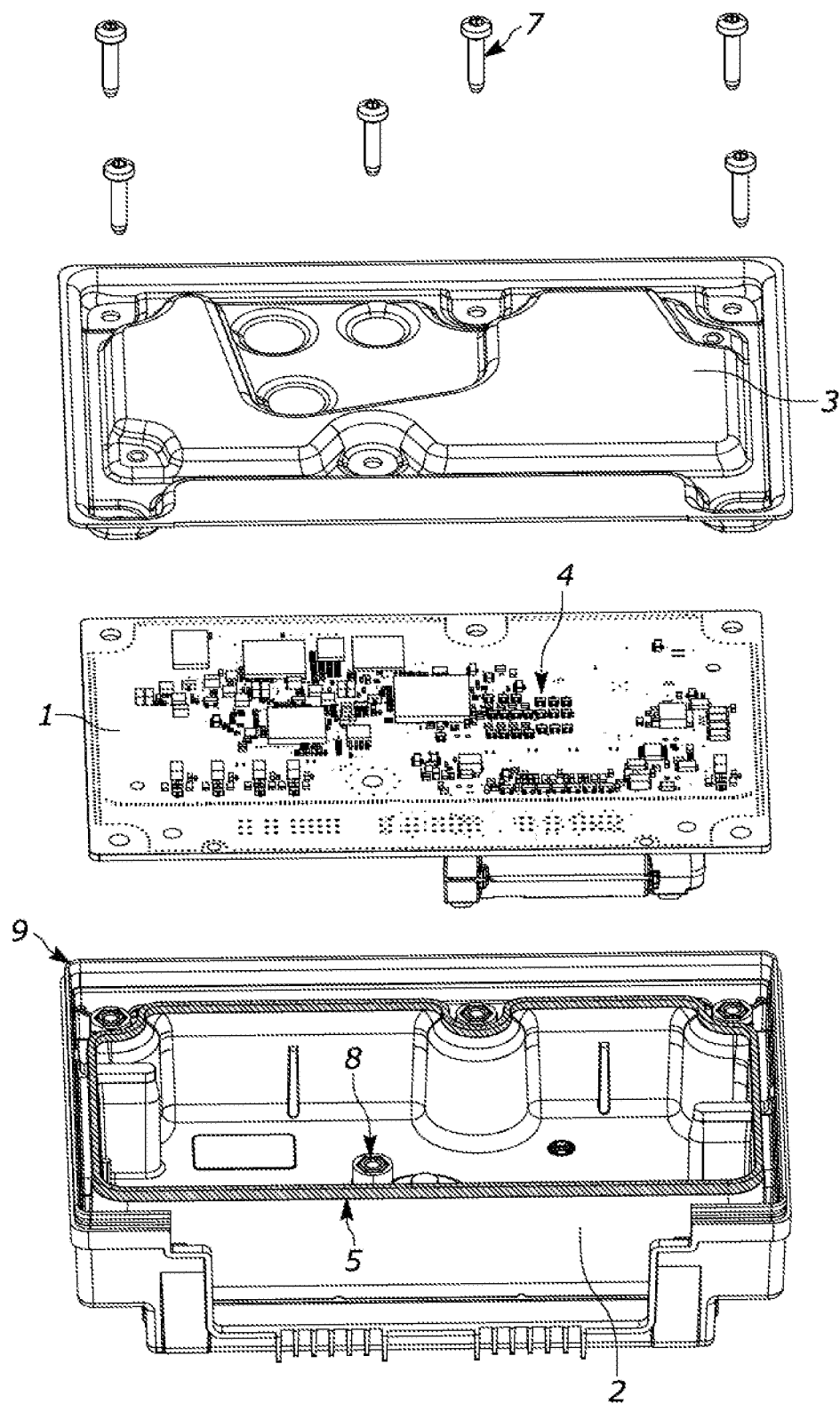

As shown in FIGS. 1a and 1b, a PCB 1 is enclosed between a top housing portion 2 and bottom housing portion 3. For ease of assembly, the top housing portion 2 and bottom housing portion 3 are preferably non-integral, meaning that prior to assembly they are two separate, non-interconnected parts. The PCB 1 contains ECU circuitry 4. ECU circuitry includes at least a processor, memory, and a data interface allowing the ECU to control one or more of the electrical systems or subsystems of the vehicle. In the disclosed embodiment, the ECU is a gateway module that manages internal communication between modules on the vehicle and external over-the-air communication. The PCB 1 includes a microprocessor, random access memory (RAM), non-volatile data storage, Ethernet switch circuitry, and a data interface. However, the improvements to an ECU housing described herein are applicable to any type of ECU.

Disposed on an inner surface of the top housing portion 2 is a top gasket 5. And disposed on an inner surface of the bottom housing portion 3 is a bottom gasket 6. The PCB 1 and housing portions 2 and 3 are held together with a series of anchors 7. In the disclosed embodiment, the anchors 7 are bolts that pass through the bottom housing portion 3 and PCB 1 and screw into the top housing portion 2. The top housing portion includes a series of nuts 8 for receiving the anchors 7 and ensuring that the bottom housing portion 3 remains tightly secured to the PCB 1 for the life of the ECU. The nuts 8 are press-fitted into recesses in the top housing portion 2. In addition to being threaded through the nuts 8, the anchors 7 also screw securely into recesses in the top housing portion 2. However, any suitable anchor can be used to fasten the housing portions together, with the PCB between them. The anchors 7 hold the top housing portion 2 and bottom housing portion 3 together sufficiently tightly that both the top gasket 5 and bottom gasket 6 are compressed against the PCB 1 and form a seal preventing the incursion of contaminants. In the disclosed embodiment, the top housing portion 2 includes an optional additional TPE gasket 9 around the periphery of its bottom edge which provides a moisture impermeable seal between the top housing portion 2 and bottom housing portion 3.

In the disclosed embodiment, the bottom housing portion 3 is a sheet metal baseplate and serves as an electromagnetic shield blocking incoming electromagnetic interference (EMI) (to ensure reliable operation of the ECU) and outgoing EMI (to avoid interfering with other modules on the vehicle). Accordingly, the bottom gasket 6 is an EMC gasket. An EMC gasket provides, in addition to a fluid seal, a conductive path between the components to be sealed, thus preventing leakage of electromagnetic interference in either direction. In the disclosed embodiment, the bottom (EMC) gasket 6 is composed of a silicone foam embedded with nickel-plated carbon particles and has a Shore A hardness of 60, but it could be composed of any material that forms a fluid seal and an electrically conductive path between the bottom housing portion 3 and the PCB 1.

In the disclosed embodiment, no electromagnetic shielding is required on the top side of the PCB 1 because all components of the ECU circuitry 4 that emit or are susceptible to EMI are located on the bottom side of the PCB 1. Thus, the top housing portion 2 is molded plastic. At high production volumes, molded plastic parts are lighter and cheaper to manufacture than cast metal parts. And sheet metal, although sometimes lower in cost, is typically not suitable for use as a top housing portion (opposite a sheet metal baseplate), for example because it provides a limited ability to implement mounting features. As noted above, housing portions not comprising an electromagnetic shield are preferably sealed against the PCB with a TPE gasket, which is cheaper than an EMC gasket and readily bonds with a molded plastic housing. Accordingly, in the disclosed embodiment, the top gasket 5 is a TPE gasket. However, depending on the specific use case, either or both of the top housing portion 2 and bottom housing portion 3 could be metal or plastic, with corresponding EMC gaskets or TPE gaskets, respectively.

In the disclosed embodiment, the top gasket 5 has a Shore A hardness of 60, which is equal to the hardness of the bottom gasket 6. To reduce strain on the PCB 1, the hardness of the top gasket 5 and hardness of the bottom gasket 6 are preferably balanced. Balancing the hardness ratings of the top gasket 5 and bottom gasket 6 does not require the ratings to be exactly equal, but they should be within 5% of each other.

Figure 2:
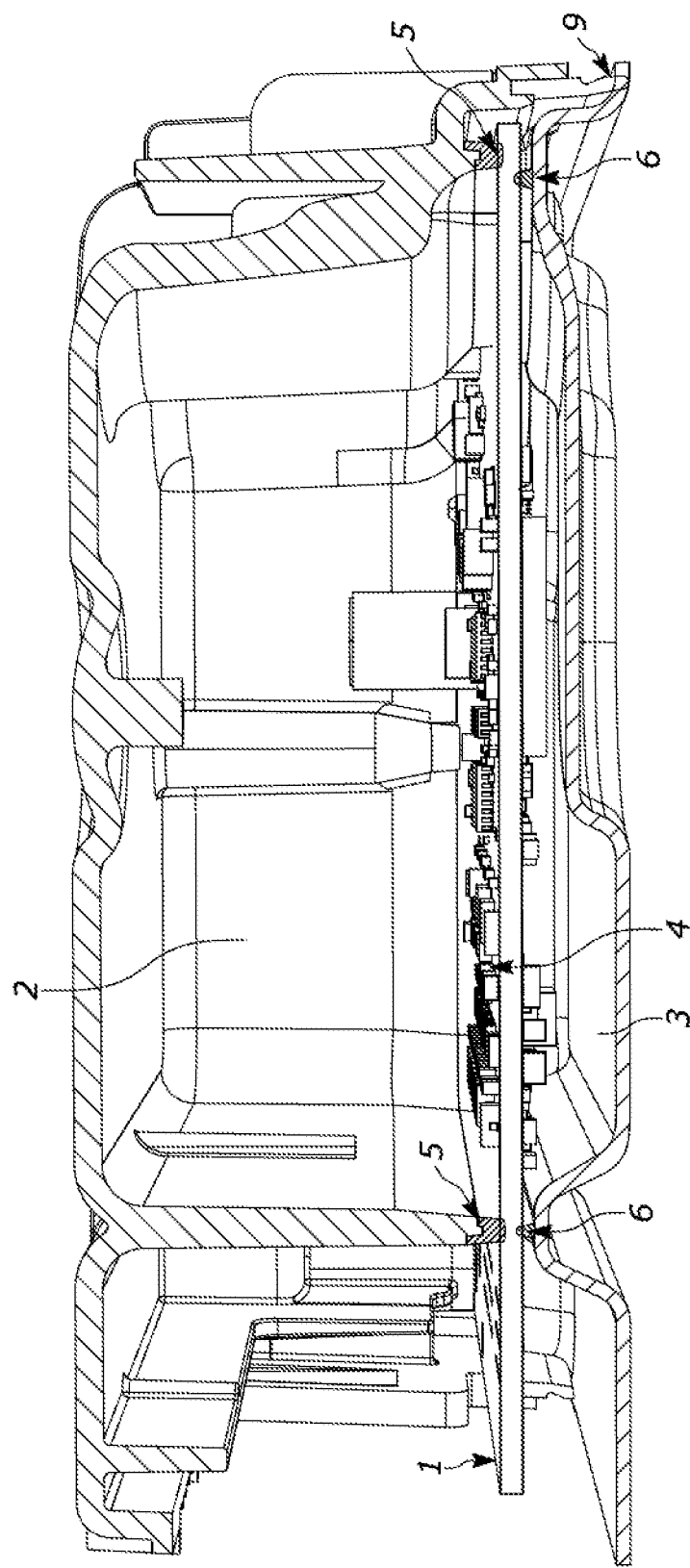
FIG. 2 is a cutout view of an improved ECU for a motor vehicle showing a PCB enclosed between two housing portions and sealed against each with a gasket.

FIG. 2 is a cut-out view of an improved ECU in its assembled state. The anchors 7 (not shown) hold the components firmly together. The top gasket 5 provides a seal between the top housing portion 2 and the top surface of the PCB 1. The bottom gasket 6 provides a seal between the bottom housing portion 3 and the bottom surface of the PCB 1. The top gasket 5 and bottom gasket 6 are disposed opposite each other on respective sides of the PCB 1. Thus, any forces imposed by the gaskets on the respective sides of the PCB are balanced, thereby avoiding strain on the PCB 1.

Figure 3:
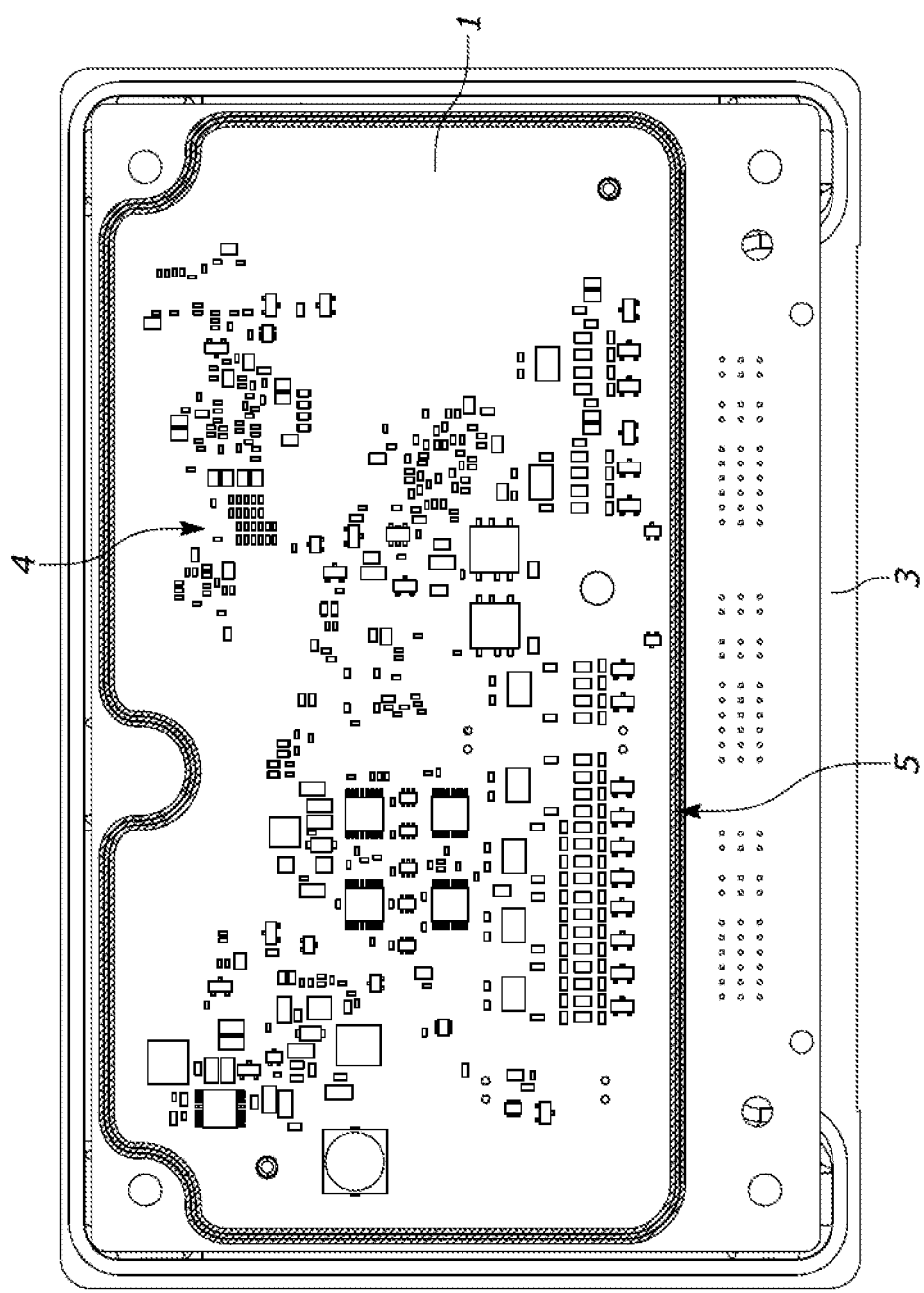
FIG. 3 is a top view of a PCB for an ECU showing the arrangement of a top gasket thereon.
Figure 4:
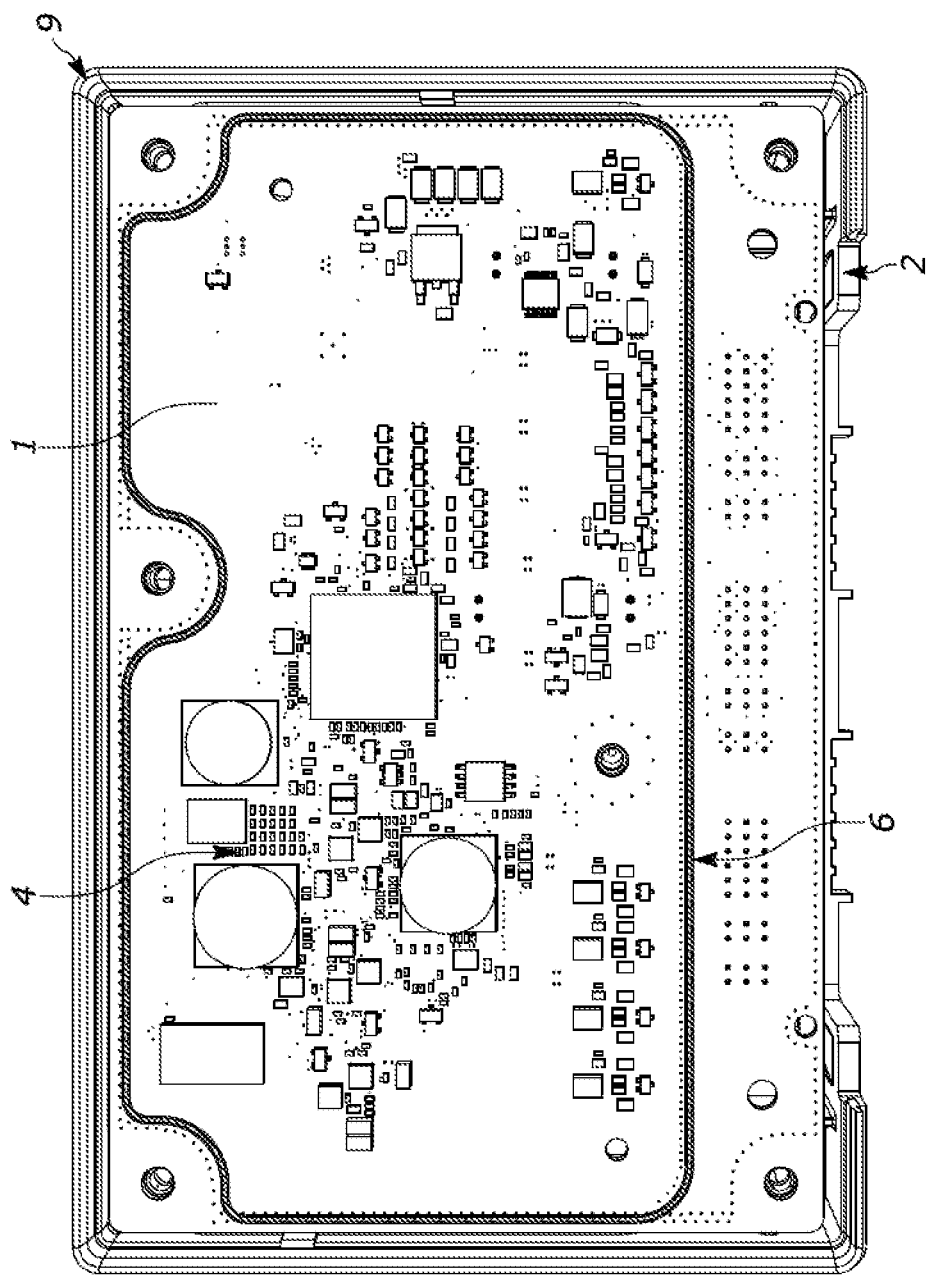
FIG. 4 is a bottom view of a PCB for an improved ECU showing the arrangement of a bottom gasket thereon.

FIGS. 3 and 4 show, respectively, the arrangement of the top gasket 5 on the top surface of the PCB 1 and the bottom gasket 6 on the bottom surface of the PCB 1. As shown, the ECU circuitry 4 is located inside of, or circumscribed by, the gaskets. Thus, when the ECU is assembled, the gaskets prevent the incursion of contaminants into the ECU circuitry.

Figure 5:
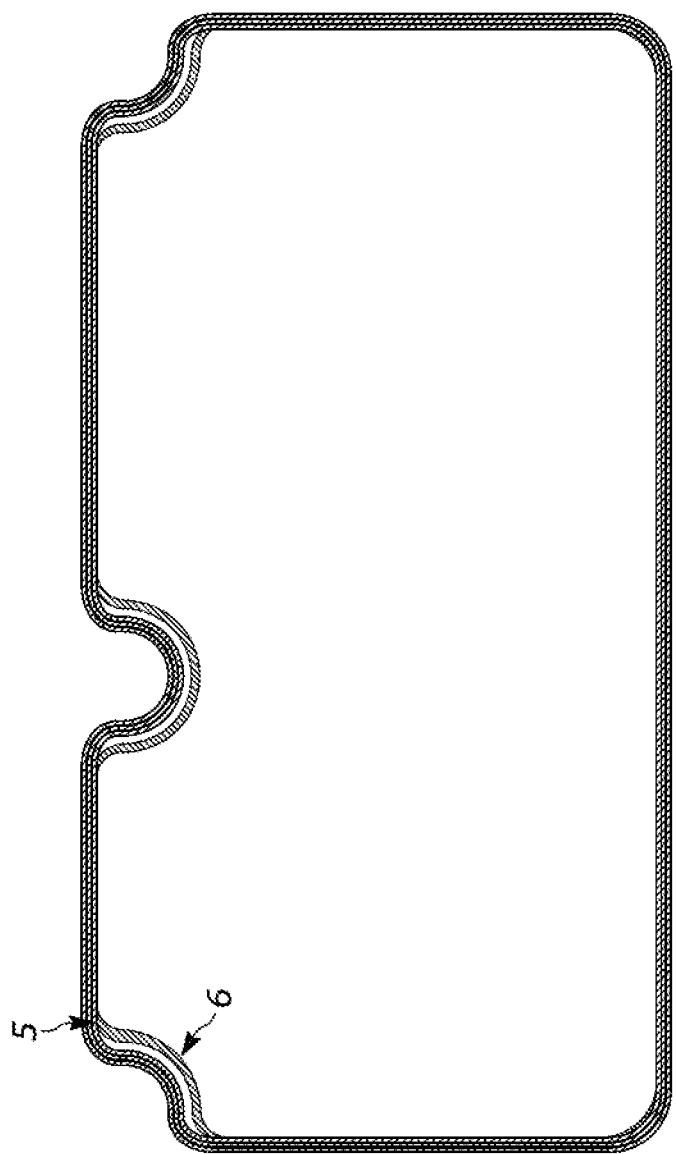
FIG. 5 is a top view of a top gasket and bottom gasket for an improved ECU overlaid on one another.

FIG. 5 shows the top gasket 5 and bottom gasket 6 overlaid on each other, as they would be in an assembled ECU, but with the PCB and housing hidden from view. As shown, the top gasket 5 and bottom gasket 6 follow nearly but not perfectly identical paths around the periphery of the PCB 1. To avoid undue strain on the PCB 1, the paths of the top gasket 5 and bottom gasket 6 should be opposite each other on respective sides of the PCB 1, but it is not required that the paths mirror each other identically. For example, in curved sections of the gaskets, their paths may deviate as long as long as the center points of any radii of curvature are offset by no more than the allowed PCB strain design limits. Likewise, in straight sections, the paths should not be offset from each other by more than the allowed PCB strain design limits.

While exemplary embodiments are described above, it is not intended that these embodiments describe all possible forms of the disclosed apparatus and method. Rather, the words used in the specification are words of description rather than limitation, and it is understood that various changes may be made without departing from the spirit and scope of the disclosure as claimed. The features of various implementing embodiments may be combined to form further embodiments of the disclosed concepts.

What is claimed is:

1. An electronic control unit for a motor vehicle comprising:
   a first housing portion;
   a first gasket;
   a second housing portion which is non-integral with the first housing portion;
   a second gasket; and
   a printed circuit board containing electronic control unit circuitry,
   wherein the first gasket provides a seal between the first housing portion and a first side of the printed circuit board, and the second gasket provides a seal between the second housing portion and a second side of the printed circuit board.

2. The electronic control unit of claim 1 wherein the first housing portion comprises an electromagnetic shield.

3. The electronic control unit of claim 2 wherein the first gasket is an electromagnetic compliance gasket.

4. The electronic control unit of claim 3 wherein he second gasket is a thermoplastic elastomer gasket.

5. The electronic control unit of claim 3 wherein the second housing portion comprises an electromagnetic shield.

6. The electronic control unit of claim 5 wherein the second gasket is an electromagnetic compliance gasket.

7. The electronic control unit of claim 1 wherein the first gasket is disposed on the first side of the printed circuit board and circumscribes one or more electrical components mounted on said first side of the printed circuit board.

8. The electronic control unit of claim 7 wherein the first gasket is compressed between the first side of the printed circuit board and the first housing portion.

9. The electronic control unit of claim 1 wherein the first gasket and second gasket are disposed opposite each other on, respectively, the first side of the printed circuit board and the second side of the printed circuit board in a manner that balances any mechanical forces imposed on the printed circuit board by the first gasket and second gasket.

10. The electronic control unit of claim 9 wherein the first gasket has a first hardness, the second gasket has a second hardness, and the first hardness and second hardness are balanced.

11. An apparatus comprising:
    a printed circuit board disposed within a housing, wherein the housing includes a first housing portion and a second housing portion, the second housing portion being non-integral with the first housing portion, wherein the printed circuit board is disposed between the first housing portion and second housing portion, wherein a first gasket is disposed between the first housing portion and a first side of the printed circuit board and provides a seal between the first housing portion and the first side of the printed circuit board, and wherein a second gasket is disposed between the second housing portion and a second side of the printed circuit board and provides a seal between the second housing portion and the second side of the printed circuit board.

12. The apparatus of claim 11 wherein the first housing portion comprises an electromagnetic shield.

13. The apparatus of claim 12 wherein the first gasket is an electromagnetic compliance gasket.

14. The apparatus of claim 13 wherein the second gasket is a thermoplastic elastomer gasket.

15. The apparatus claim 13 wherein the second housing portion comprises an electromagnetic shield.

16. The apparatus of claim 15 wherein the second gasket is an electromagnetic compliance gasket.

17. The apparatus of claim 11 wherein the first gasket and second gasket are disposed, respectively, opposite each other on the first side of the printed circuit board and the second side of the printed circuit board in a manner that balances any mechanical forces imposed on the printed circuit board by the first gasket and the second gasket.

18. The apparatus of claim 17 wherein the first gasket has a first hardness, the second gasket has a second hardness, and the first hardness and second hardness are balanced.

19. The apparatus of claim 11 wherein the first gasket is disposed on a first side of the printed circuit board and circumscribes one or more electrical components mounted on said first side of the printed circuit board.

20. The apparatus claim 19 wherein the first gasket is compressed between the first side of the printed circuit board and the first housing portion.

* * * * *

UNITED STATES PATENT AND TRADEMARK OFFICE
CERTIFICATE OF CORRECTION

PATENT NO. : 11,839,043 B2
APPLICATION NO. : 17/243953
DATED : December 5, 2023
INVENTOR(S) : Hadwan et al.

It is certified that error appears in the above-identified patent and that said Letters Patent is hereby corrected as shown below:

In the Claims

Column 4, Line 42 should read: --4. The electronic control unit of claim 3 wherein the--.

Signed and Sealed this
Second Day of April, 2024

Katherine Kelly Vidal
*Director of the United States Patent and Trademark Office*